United States Patent
Asano et al.

[11] Patent Number: 5,897,327
[45] Date of Patent: Apr. 27, 1999

[54] METHOD OF EVALUATING A SEMICONDUCTOR WAFER

[75] Inventors: Eiichi Asano; Hisami Motoura; Yasuhiro Shimada, all of Kanagawa, Japan

[73] Assignee: Komatsu Electronic Metals Co., Ltd., Kanagawa, Japan

[21] Appl. No.: 09/014,084

[22] Filed: Jan. 27, 1998

[30] Foreign Application Priority Data

Jan. 27, 1997 [JP] Japan .................................. 9-027214

[51] Int. Cl.$^6$ .............................. G01R 31/26; H01L 21/66
[52] U.S. Cl. ................................................. 438/17; 438/14
[58] Field of Search ........................................ 438/17, 14

[56] References Cited

U.S. PATENT DOCUMENTS

| | | | |
|---|---|---|---|
| 5,391,502 | 2/1995 | Wei | 438/17 |
| 5,396,169 | 3/1995 | Buehler et al. | 438/17 |
| 5,543,334 | 8/1996 | Yoshii et al. | 438/17 |
| 5,635,410 | 6/1997 | Kusudo | 438/17 |
| 5,668,062 | 9/1997 | Hyun et al. | 438/462 |

*Primary Examiner*—Kevin M. Picardat
*Assistant Examiner*—Deven Couzos
*Attorney, Agent, or Firm*—Sughrue, Mion, Zinn, Macpeak & Seas, PLLC

[57] ABSTRACT

A MOS capacitor in which an insulating layer of thermal oxide film is disposed between the electrode 2 and the silicon wafer 1 is formed. While a light beam of an energy larger than 1.1 eV is irradiated on the electrode 2 and its periphery, electrons inject from the electrode 2 side (voltage is applied from the silicon wafer 1 side). The injected electrons are activated by the light irradiation. For both p-type or n-type semiconductor, the dielectric breakdown electric field strength can be precisely measured according to the degree of processing defects. The evaluation method is particularly effective for the n-type semiconductor wafer, which was difficult to evaluate by the prior art.

6 Claims, 4 Drawing Sheets

METHOD OF EVALUATING A SEMICONDUCTOR WAFER

BACKGROUND OF THE INVENTION

1. Field of the invention

The present invention relates to a method of evaluating a semiconductor wafer. In particular, it relates to a method of evaluating a semiconductor wafer, which is suitable for judging the quality of a mirror-polishing process and the quality of the polishing process.

2. Description of the Related Art

Semiconductor devices are usually manufactured by a silicon wafer which has at least one mirror-polished surface and is obtained by slicing a silicon single crystal manufactured by using the CZ method or the FZ method, chamfering the periphery, grinding the surface and reverse surface, lapping, polishing and heat treating.

In recent years, with the scaling-down of semiconductor devices and the high degree of integration, the dielectric strength of thermally grown oxide film characteristic has particularly received attention. One cause that lowers the dielectric strength of thermally grown oxide film of LSI is the processing flaw or the residual stress produced in the process of grinding and polishing for the mirror surface finish of the silicon wafer. The degree of the damage of the wafer surface caused by processing can be evaluated by means of measuring the dielectric strength of thermally grown oxide film.

The method for evaluating the dielectric strength of thermally grown oxide film of a silicon wafer is carried out by the following procedures. First, the mirror-polishing processed silicon wafer is cleaned and then is heat-treated in an oxidizing atmosphere to form a thermal oxide film on the wafer surface. Next, a polysilicon layer is formed on the thermal oxide film by the CVD method, and then a predetermined number of electrodes having a predetermined area are formed by photolithography. By subjecting the wafer to these procedures, a MOS capacitor in which an insulating layer of thermal oxide film is disposed between the electrodes and the silicon wafer is formed. Thereafter, a voltage is applied between the electrodes and the silicon wafer, and the electric current is measured while the applied voltage is raised in a predetermined step. The current-voltage characteristic obtained by this measurement is referred as the I-V characteristic. In this I-V characteristic, the electric field causes a certain leakage current leaks through the insulating layer, for example a current of 10 $\mu$A, is deemed "the dielectric breakdown electric field of the insulating layer".

When the wafer to be evaluated is a p-type semiconductor, the voltage is applied from the side of the wafer 1 as shown in FIG. 5. That is, the electrons inject from the side of the electrode 2. As a result, an I-V characteristic diagram as shown in FIG. 6 is obtained. In FIG. 6, "A", "B", "C" and "D" are the symbols for distinguishing mirror-polishing line or mirror-polishing process. "A" represents a wafer obtained by normal processing, and following the "B", "C" and "D" order, the degree of the damage of the wafer due to the processing deteriorates. That is, wafer "A" has the highest dielectric breakdown electric field, while the dielectric breakdown electric field decreases according to the order of "B", "C" and "D".

In contrast, when the wafer to be evaluated is an n-type semiconductor, the voltage is applied from the electrode 2 as shown in FIG. 7. That is, the electrons inject from the silicon wafer 1. As a result, the I-V characteristic diagram as shown in FIG. 8 is obtained.

Applying grinding and polishing for the purpose of mirror-polishing the silicon wafer subjects the wafer surface to some processing injuries such as scratchs which can not be identified visually, or local residual stress which also can not be identified visually. The above processing injuries are hereinafter referred as processing defects. The above processing defects of the wafer surface conventionally are evaluated by the dielectric strength of thermally grown oxide film evaluation method in which electrons are injected (voltages are applied) to cause majority carriers to enter an accumulated state. Accordingly, for p-type semiconductor, as shown in FIG. 6, it is possible to distinguish "A", no processing defects, and "B", "C" and "D", having different degree of processing defects, and to read the intensity of the electric field. However, for n-type semiconductor, as can be seen from the I-V characteristic curve of FIG. 8, compared to "A", with no processing defects, it is very difficult to distinguish "B", "C" and "D". And thus it is not possible to precisely detect whether there are processing defects.

SUMMARY OF THE INVENTION

In view of the above problems of the prior art, an object of the invention is to provide a method for evaluating a semiconductor wafer, capable of precisely measuring the degraded state of the dielectric strength of thermally grown oxide film caused by processing defects, regardless of the varieties of the conductivity type of the semiconductor wafer, so as to improve the processing of the wafer.

In order to attain the above object, the method of evaluating the semiconductor wafer of the invention is characterized in that, when evaluating a dielectric strength of thermally grown oxide film of a semiconductor wafer, after forming the oxide film by the oxidation of the semiconductor wafer and further forming an electrode on the oxide film, electrons inject from electrodes (voltage is applied from the side of the substrate) while light is irradiated on the electrode and the periphery thereof.

Moreover, the evaluation of the dielectric strength of thermally grown oxide film of the semiconductor wafer is characterized in that the irradiation energy is larger than 1.1 eV.

A first aspect of the method of evaluating a semiconductor wafer is a method of the present invention, which comprises the steps of:

forming an oxide film and electrode on the semiconductor wafer to be evaluated successively;

measuring an I-V characteristic between the semiconductor wafer and the electrode by impinging electrons from electrodes (voltage is applied to the substrate) while irradiating a light on the electrode and the periphery thereof.

A second aspect of the method of evaluating a semiconductor wafer is a method according to the first aspect, wherein the irradiation energy is larger than 1.1 eV in the step of measuring.

A third aspect of the method of evaluating a semiconductor wafer is a method according to the first aspect, wherein the semiconductor wafer to be evaluated is a processed wafer.

A fourth aspect of the method of evaluating a semiconductor wafer is a method according to the third aspect, wherein the semiconductor wafer to be evaluated is a mirror polished wafer.

A fifth aspect of the method of evaluating a semiconductor wafer is a method according to the first aspect, wherein the semiconductor wafer to be evaluated is a p-type silicon wafer.

A sixth aspect of the method of evaluating a semiconductor wafer is a method according to the first aspect, wherein the semiconductor wafer to be evaluated is a n-type silicon wafer.

According to the above, in order to evaluate the dielectric strength of thermally grown oxide film of a semiconductor wafer, a MOS capacitor is formed using the wafer to be evaluated, and when the electrons inject from the electrode, light is irradiated on the electrode and the periphery thereof, and thus the injected electrons are activated and a I-V characteristic corresponding to the degree of the processing defects remaining on the wafer is shown. The MOS capacitor is formed by the step of forming an oxide film by thermal oxidation of the semiconductor wafer and the step of forming an electrode on the oxide film As the energy necessary to activate the electrons injected into the semiconductor wafer is larger than 1.1 eV, when evaluating the dielectric strength of thermally grown oxide film, irradiating a light having an energy of larger than 1.1 eV on the electrode and the periphery thereof can obtain a precise I-V characteristic diagram.

BRIEF DESCRIPTION OF THE DRAWING

Next, the embodiment of the method for evaluating a semiconductor wafer according to the invention is described with reference to the drawings in which.

DETAILED DESCRIPTION OF THE PREFERRED EMBODIMENT

Figure 1:
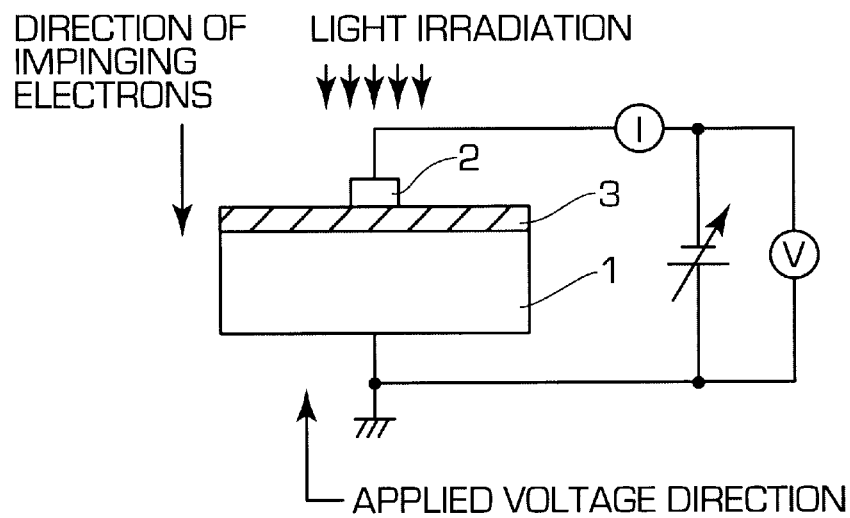
FIG. 1 is a schematic diagram showing the method of measuring the dielectric strength of thermally grown oxide film of an n-type semiconductor wafer.

FIG. 1 depicts a schematic diagram showing the method of measuring the dielectric strength of thermally grown oxide film of an n-type semiconductor wafer. A MOS capacitor in which an insulating layer of thermal oxide film 3 is disposed between the electrode 2 and the silicon wafer 1 is formed. Above the electrode 2, a lamp for irradiating light is disposed. Thereafter, a voltage is applied from the silicon wafer 1 side to the electrode 2 while irradiating a light on the electrode 2 and the periphery thereof. The electrons are injected from the electrode 2 side to the silicon wafer 1 side. By measuring the current at the time while raising the applied voltage in predetermined steps, an I-V characteristic diagram as shown in FIG. 2 is obtained.

Figure 2:
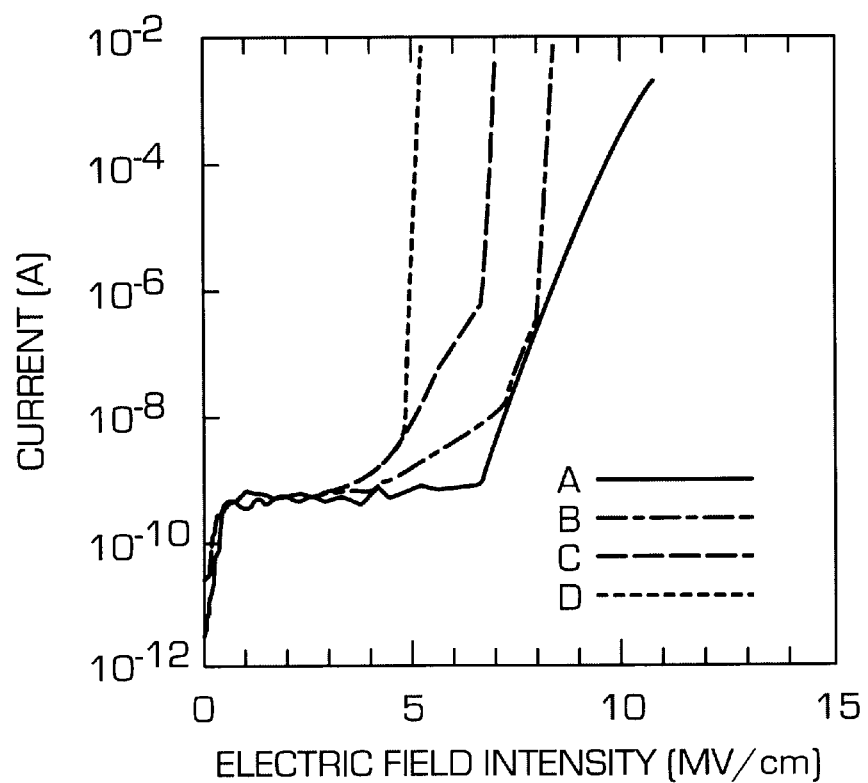
FIG. 2 is a I-V characteristic diagram obtained by measuring the dielectric strength of thermally grown oxide film while light is irradiated on a n-type semiconductor wafer.
Figure 8:
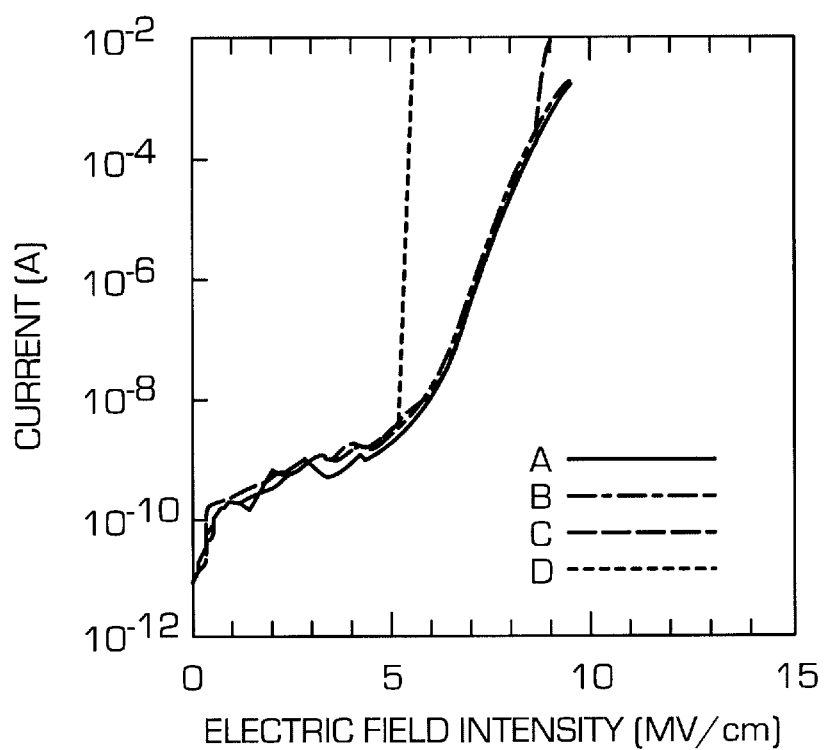
FIG. 8 is an I-V characteristic diagram obtained by measuring the dielectric strength of thermally grown oxide film of an n-type semiconductor wafer according to the prior art.

As shown in FIG. 2, the four kinds of silicon wafer, corresponding to "A", "B", "C" and "D", are the same wafer as the n-type semiconductor wafer described in the prior art (see FIG. 8).

According to the prior art, the electrons inject from the silicon wafer 1 side while in the embodiment the electrons inject from the electrode 2 side. Moreover, as the injected electrons are activated by irradiating a light, it is possible to distinguish clearly "A", "B", "C" and "D" by the degree of the processing defects, and the intensity of the insulation breakdown electric field of each can be precisely evaluated.

Figure 3:
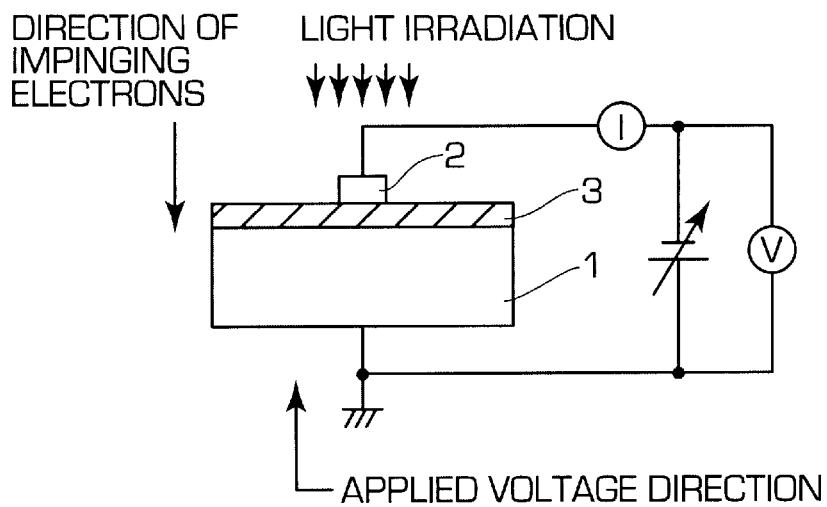
FIG. 3 is a schematic diagram showing the method of measuring the dielectric strength of thermally grown oxide film of a p-type semiconductor wafer.
Figure 4:
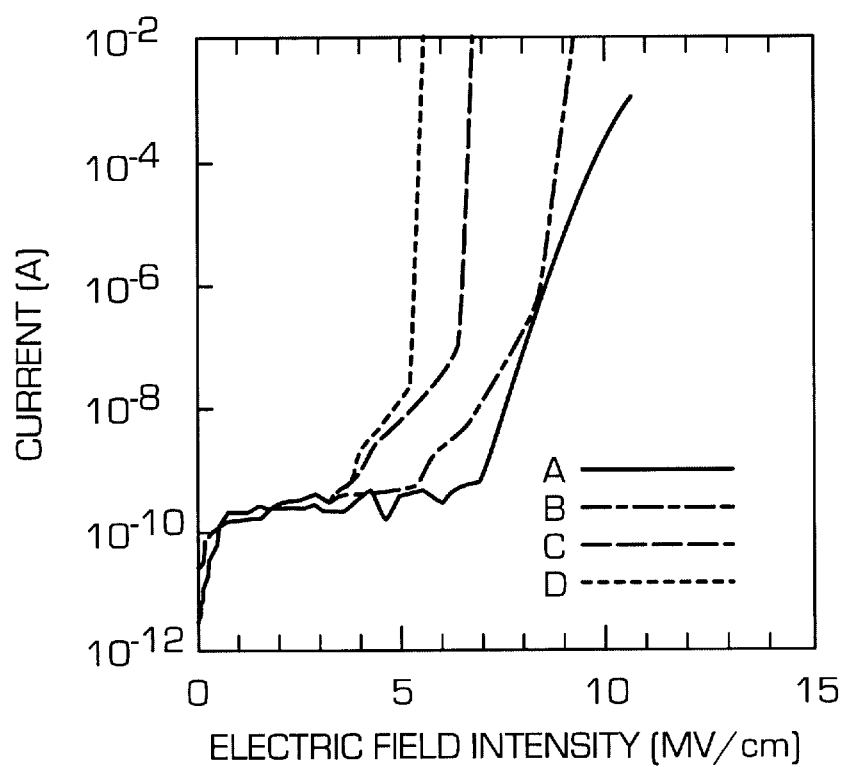
FIG. 4 is a I-V characteristic diagram obtained by measuring the dielectric strength of thermally grown oxide film while light is irradiated on a p-type semiconductor wafer.
Figure 5:
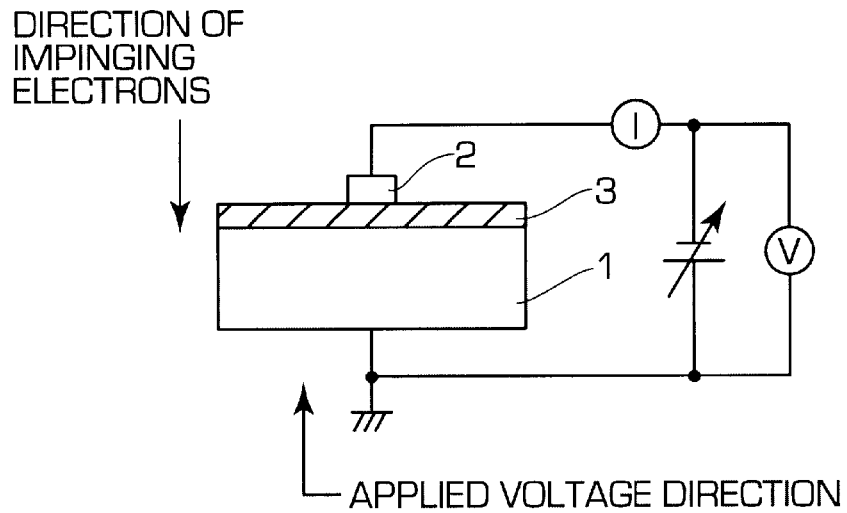
FIG. 5 is a schematic diagram showing the method of measuring the dielectric strength of thermally grown oxide film of a p-type semiconductor wafer according to the prior art.
Figure 6:
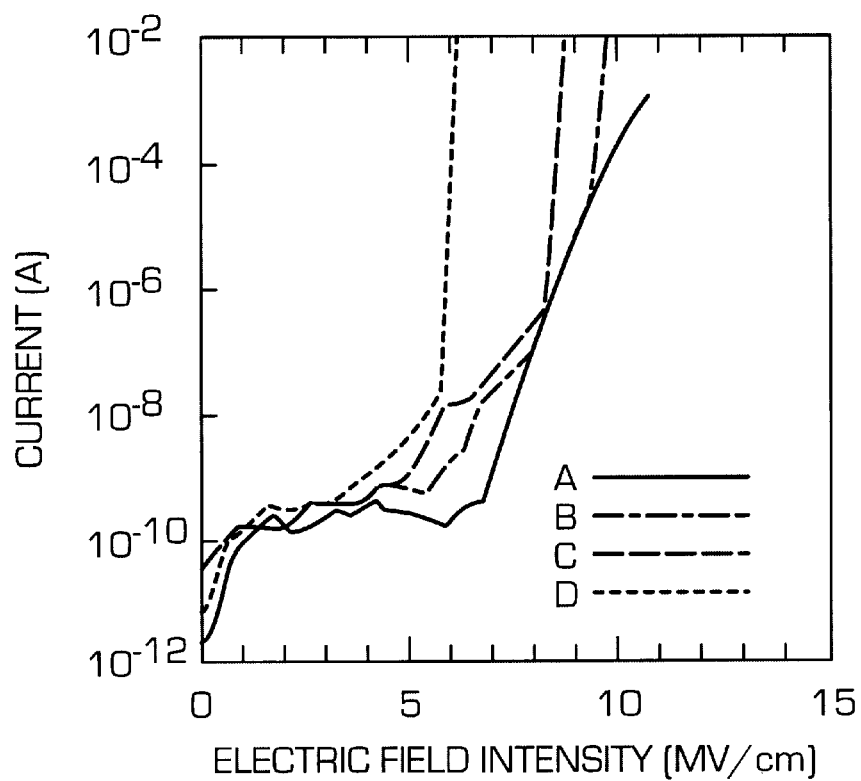
FIG. 6 is an I-V characteristic diagram obtained by measuring the dielectric strength of thermally grown oxide film of a p-type semiconductor wafer according to the prior art.
Figure 7:
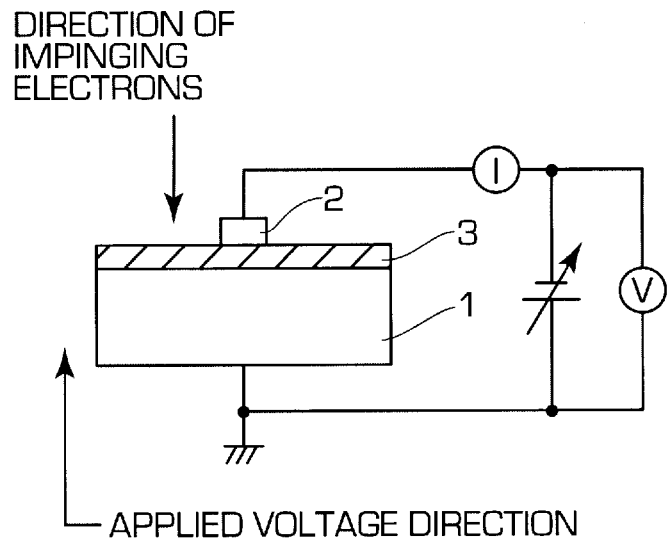
FIG. 7 is a schematic diagram showing the method of measuring the dielectric strength of thermally grown oxide film of an n-type semiconductor wafer according to the prior art.

FIG. 3 is a schematic diagram showing the method of measuring the dielectric strength of thermally grown oxide film of a p-type semiconductor wafer. The situation of the p-type semiconductor wafer is the same as that of the n-type semiconductor wafer as shown in FIG. 1, the electrons inject from the electrode 2 side and the injected electrons are activated by light irradiation. By measuring the current while raising the voltage applied from the silicon wafer 1 side to the electrode 2 in predetermined steps, an I-V characteristic diagram as shown in FIG. 4 is obtained.

For p-type semiconductor wafer, it is also possible to evaluate the dielectric strength of thermally grown oxide film by the prior art. However, compared to the I-V characteristic diagram obtained by the prior art, in the I-V characteristic diagram, when compared to "A", "B", "C" and "D" have larger space. And thus it is known that using the evaluation method of the invention, a more precise evaluation is possible.

As described above, according to the invention, when evaluating the dielectric strength of thermally grown oxide film, as the electrons inject on the electrode, which forms the MOS capacitor, and the periphery while a light larger than 1.1 eV is irradiated, the injected electrons are activated. For both p-type semiconductor and n-type semiconductor, the degraded state of the dielectric strength of thermally grown oxide film caused by the damage in the mirror-polishing process can be precisely detected. Accordingly, by feedbacking the information obtained by the evaluating method of the invention to the polishing process line, the mirror-polishing process can be improved.

What is claimed is:

1. A method of evaluating a semiconductor wafer, comprising:

forming an oxide film and electrode on the semiconductor wafer; and measuring an I-V characteristic between the semiconductor wafer and the electrode by impinging electrons from electrodes and applying voltage to the substrate while irradiating the electrode and periphery thereof with light.

2. The method of evaluating a semiconductor wafer as claimed in claim 1, wherein the irradiation energy is larger than 1.1 eV in the step of measuring.

3. The method of evaluating a semiconductor wafer as claimed in claim 1, wherein the semiconductor wafer to be evaluated is a processed wafer.

4. The method of evaluating a semiconductor wafer as claimed in claim 3, wherein the semiconductor wafer to be evaluated is a mirror polished wafer.

5. The method of evaluating a semiconductor wafer as claimed in claim 1, wherein the semiconductor wafer to be evaluated is a p-type silicon wafer.

6. The method of evaluating a semiconductor wafer as claimed in claim 1, wherein the semiconductor wafer to be evaluated is a n-type silicon wafer.

* * * * *